(12) United States Patent
Bhattacharya

(10) Patent No.: US 8,421,540 B1
(45) Date of Patent: Apr. 16, 2013

(54) METHOD AND APPARATUS FOR RUN-TIME SHORT CIRCUIT PROTECTION FOR AMPLIFIERS

(75) Inventor: Anindya Bhattacharya, Tucson, AZ (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 13/155,100

(22) Filed: Jun. 7, 2011

(51) Int. Cl.
*H02H 7/20* (2006.01)

(52) U.S. Cl.
USPC ........................................ 330/298; 330/207 P

(58) Field of Classification Search .................. 330/298, 330/207 P, 129, 136
See application file for complete search history.

(56) References Cited

U.S. PATENT DOCUMENTS

| | | | | |
|---|---|---|---|---|
| 6,593,812 | B2 * | 7/2003 | Sundstrom | 330/136 |
| 7,466,195 | B2 * | 12/2008 | Drogi et al. | 330/136 |
| 7,675,360 | B2 * | 3/2010 | Arai et al. | 330/129 |
| 7,714,655 | B2 | 5/2010 | Matalon | 330/255 |

OTHER PUBLICATIONS

"SPiKe Protection Safeguards Monolithic IC and Output Power Discretes" by John DeCelles (13 pgs).
"Protection of Audio Amplifiers Based on Temperature Measurements in Power Transistors" by Benno Krabbenborg; 2004 IEEE International Solid-State Circuits Conference (8 pgs).
"Integrated Overcurrent Protection System for Class-D Audio Power Amplifiers" by Marco Berkhout; IEEE Journal of Solid-State Circuits, vol. 40, No. 11, Nov. 2005. pp. 2237-2245 (9 pgs).
"Op Amp Combining Precision, High Speed, and High Output Drive for ±5-V Power Supply Operation" by Tuan Ngo and Rick Hester; IEEE Journal of Solid-State Circuits, vol. 25, No. 3, Jun. 1990. pp. 856-862 (7 pgs).
"High-Gain 15-W Monolithic Power Amplifier With Internal Fault Protection" by Ernest L. Long and Thomas M. Frederiksen; IEEE Journal of Solid-State Circuits, vol. sc-6, No. 1, Feb. 1971. pp. 35-44 (10 pgs).
"An Integrated Amplifier for an Active Car-Radio Antenna" by Ernest H. Nordholt and Bernie C. Van Eerden; IEEE Journal of Solid-State Circuits, vol. sc-17, No. 3, Jun. 1982. pp. 591-593 (3 pgs).

\* cited by examiner

*Primary Examiner* — Henry Choe
(74) *Attorney, Agent, or Firm* — Hayes Soloway P.C.

(57) ABSTRACT

The system contains a first input receiving a signal from the amplifier input. A second input receives a signal from the amplifier output. A gain modification device is connected to the second input thereby reducing an amplitude of the signal from the amplifier output. A difference element connected to the gain modification device and the first input subtracts one of the first input and the second input from the other of the first input and the second input and outputting a difference voltage. A comparator, connected to the difference element and a threshold voltage source, compares the difference voltage to a threshold voltage. A disabling device is connected to the comparator and an output stage of the amplifier, wherein an output stage of the amplifier is disabled when the threshold voltage exceeds the difference voltage.

16 Claims, 17 Drawing Sheets

METHOD AND APPARATUS FOR RUN-TIME SHORT CIRCUIT PROTECTION FOR AMPLIFIERS

FIELD

The present disclosure is generally related to short circuit protection for amplifiers, and more particularly is related to a system and method for run-time short circuit protection for amplifiers.

BACKGROUND

Audio power amplifiers are widely used in various applications to amplify audio signals and drive speaker loads. Many of the medium to high power audio amplifiers employ power integrated circuits for lower cost and better integration. In some applications, such as automotive, the power integrated circuits are subjected to very severe conditions where the outputs can potentially short to various voltage potentials available in the vehicle environment. FIG. 1 shows an illustration describing a nominal listening level in a class H audio amplifier in the prior art. The power IC outputs are shown as arbitrary waveforms. The power supply rails VDD and VSS track the audio outputs as shown in the figure. The battery voltage is not within the rails that the power IC sees. However, the outputs or speaker terminals can short to the battery voltage.

Class H audio amplifiers using power integrated circuits have been developed for better efficiency compared to class AB amplifiers. The power integrated circuits in these class H amplifiers are sometimes subjected to shorts at the board and system level while the IC is amplifying audio signals. Unlike previous class AB amplifiers, the power integrated circuit outputs in a class H system could short to voltage potentials that are unrelated to its power supply rails, as illustrated in FIG. 1. This creates a major challenge in fast detection of shorts and protection of the power integrated circuit.

Prior solutions for short circuit protection in power integrated circuits focus on sensing current through the output driver devices and flagging an overcurrent condition if the current goes beyond a pre-determined threshold voltage. FIG. 2 is an illustration of the block diagram of the overcurrent scheme implemented in an exemplary power integrated circuit in the prior art. During a short circuit event usually the current through the output driver device(s) will increase drastically to cause an overcurrent event. There are two disadvantages to using overcurrent protection alone as a mechanism to protect a class H power integrated circuit against short circuit. First, in certain short circuit situations, the current through the actual output devices is lower than the overcurrent threshold. An example is shown in FIG. 3 where the majority of the high current from the battery will flow through the body diode of the high side device (D1 or D3 in FIG. 2) which is not detected by overcurrent protection. Second, the overcurrent protection mechanism is not able to determine the exact nature of the fault and report it back to system controller.

FIGS. 3(a)-(d) are an illustration of exemplary simulation results for a speaker terminal short circuit to battery voltage in the prior art. In this simulation test bench, the conditions were made similar to the one described in FIG. 1, which corresponds to a nominal listening level. The short to battery is applied at 6 milliseconds to OUTx(+), and the output is kept shorted for the remainder of the simulation. The current drawn by device $M_{N+}$ during a short to battery is shown in FIG. 3(a). This output driver device carries most amount of current in comparison to the other three output devices because of amplifier feedback in response to output shorted to battery. Even though there is a high peak transient current, the current sense voltage Vocm+ shown in FIG. 3(b) is not high enough to generate an overcurrent flag. The current sense mechanism does not have enough bandwidth to capture the very fast initial current transient in device. The current drawn by parasitic body diode device D1 is shown in FIG. 3(c). This diode is forward biased during the short circuit. The overcurrent protection or current sense mechanism is not able to sense current through the body diode D1. The current through diode D1 as shown in FIG. 3(c) is much higher in magnitude than output driver device $M_{N+}$ and is high enough to cause destruction in diode D1 and output drive $M_{P+}$. FIG. 3(d) shows the current sense voltage Vocp+, which does not capture the high current through the diode D1. Based upon simulation results in FIG. 3(a)-(d), it can be concluded that overcurrent protection is not sufficient in protecting the power integrated circuit under all possible short circuit conditions in a vehicle environment.

Another approach for short circuit protection of power integrated circuits is a high side and low side sense current comparison. This approach has the advantage of detecting short circuit conditions even in scenarios where driver device current does not exceed overcurrent trip threshold. The current sense voltage for opposing hi-side and lo-side driver device is compared. If the currents are significantly imbalanced, then the output of the difference amplifier will be high enough to cause the comparators to trip indicating a short circuit. The disadvantages of this method are: 1) this method works for a fully differential bridge configuration, but not a speaker driven in a single ended half bridge configuration; 2) it is very difficult for this method to distinguish between short to the negative side of the power source (−VP) and short to ground, so there is the possibility of inaccurate fault reporting with this method; and 3) this method does not detect a shorted speaker condition.

Thermal modeling of output driver device based upon current sense and voltage drop from supply voltage has also been used in the past for protection against short circuit conditions. However they suffer the same disadvantages as overcurrent protection methods.

Thus, an unaddressed need exists in the industry to address the aforementioned deficiencies and inadequacies.

SUMMARY

Embodiments of the present disclosure provide a system and method for short circuit protection for amplifiers. Briefly described, in architecture, one embodiment of the system, among others, can be implemented as follows. The system contains a first input receiving a signal from the amplifier input. A second input receives a signal from the amplifier output. A gain modification device is connected to the second input thereby reducing an amplitude of the signal from the amplifier output. A difference element connected to the output of the gain modification device and the first input subtracts one of the first input and the second input from the other of the first input and the second input and outputting a difference voltage. A comparator, connected to the difference element and a threshold voltage source, compares the difference voltage to a threshold voltage. A disabling device is connected to the comparator and an output stage of the amplifier, wherein an output stage of the amplifier is disabled when the threshold voltage exceeds the difference voltage.

The present disclosure can also be viewed as providing methods for short circuit protection in amplifiers. In this regard, one embodiment of such a method, among others, can be broadly summarized by the following steps: obtaining an amplifier input signal and an amplifier output signal; modifying an amplitude of an amplifier output signal; finding a difference between the amplifier input signal and the modified amplifier output signal; comparing the difference to a threshold, and disabling an output of the amplifier approximately when the difference exceeds the threshold.

Other systems, methods, features, and advantages of the present disclosure is will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale. Instead, emphasis is being placed upon illustrating clearly the principles of the present disclosure. Moreover, in the drawings, like reference numerals designate corresponding parts throughout the several views.

DETAILED DESCRIPTION

Figure 4:
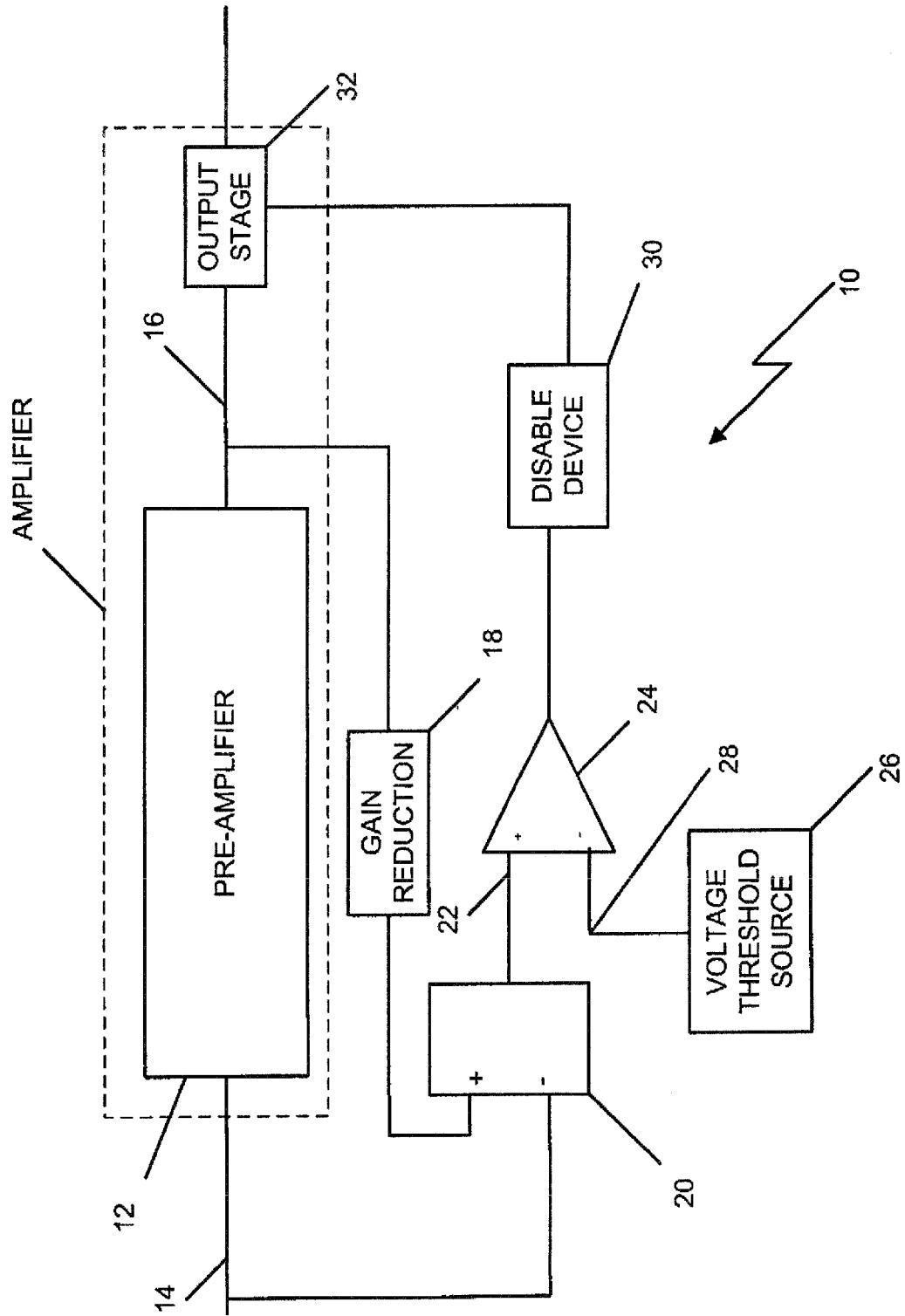
FIG. 4 is an illustration of a block diagram of a short circuit protection system in accordance with a first exemplary embodiment of the present disclosure.

FIG. 4 is an illustration of a block diagram of a short circuit protection system 10 for a single-ended amplifier in accordance with a first exemplary embodiment of the present disclosure. The amplifier includes a pre-amplifier 12 and an output stage 32. A first input 14 receives a signal that is delivered as an input for the pre-amplifier 12. A second input 16 receives a signal from the output of the pre-amplifier 12. A gain modification device 18 is connected to the second input 16 thereby reducing an amplitude of the signal from the output of the pre-amplifier 12. A difference element 20 connected to the gain modification device 18 and the first input 14 finds the difference between the first input 14 and the output of gain modification device 18 and outputs a difference voltage 22. A comparator 24, connected to the difference element 20 and a threshold voltage source 26, compares the difference voltage 22 to a threshold voltage 28. A disabling device 30 is connected to the comparator 24 and the output stage 32 of the amplifier, wherein an output stage 32 of the amplifier is disabled when the threshold voltage 28 is exceeded by the difference voltage 22.

This short circuit protection system 10 is able to detect a short circuit condition in which the shorting voltage is not in the same domain as the amplifier/power IC supply rails. This scenario is a very likely one in a class H amplifier system. This short circuit protection system 10 is able to accurately report the exact nature of a fault without the need to run additional diagnostics. This short circuit protection system 10 is able to detect shorts to any positive, negative, or ground voltage and report it. This short circuit protection system 10 can detect a shorted speaker condition. This short circuit protection system 10 can be used for both full and half bridge output configuration. This short circuit protection system 10 protects power ICs against short circuit without the need for additional current sensing circuitry, which is very useful for power ICs that do not have current monitoring capability for every output driver device. This short circuit protection system 10 allows for quick detection of short circuits, and in most cases, the output stage will be turned off before the onset of very high current in the output devices. Quickly turning off the output stage significantly improves reliability of the power IC that is subjected to multiple short circuit events during its entire lifetime.

For fully differential amplifiers, two difference elements are used. Each difference element will take the difference between the attenuated or gain reduced single-ended output and corresponding single-ended input. Two comparators are used to compare the two difference voltages to a threshold voltage. The disabling device will disable the fully differential output stage when either one of the difference voltages exceeds the threshold voltage. Fully differential amplifiers are well known in the industry, and the disclosure claimed herein is applicable to fully differential amplifiers as follows.

Figure 5:
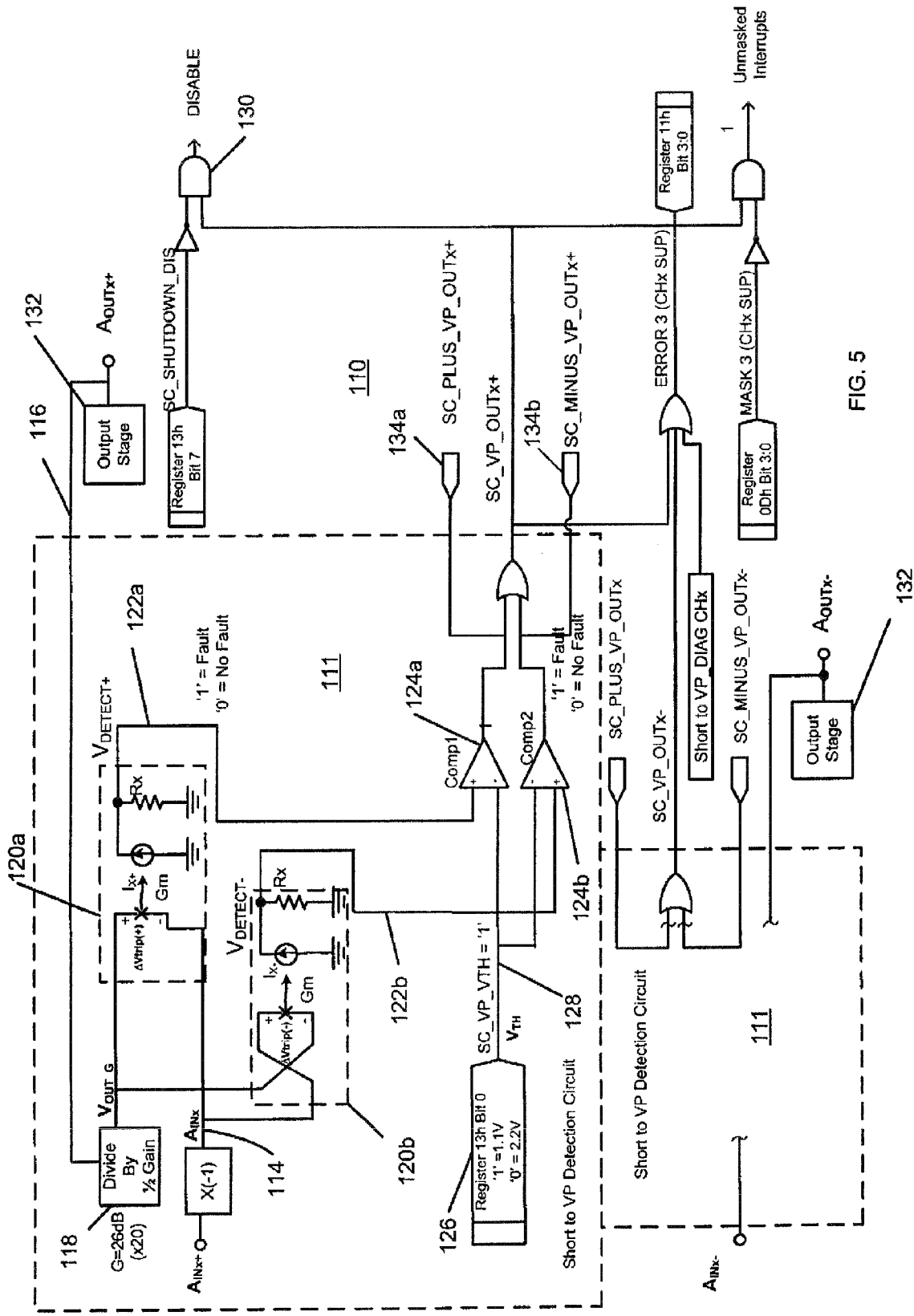
FIG. 5 is an illustration of a block diagram of a short circuit protection system in accordance with a second exemplary embodiment of the present disclosure.

FIG. 5 is an illustration of a block diagram of a short circuit protection system 110 for a fully differential amplifier in accordance with a second exemplary embodiment of the present disclosure. The short circuit protection system 110 includes two substantially similar Short to VP detection circuits 111 (detecting a short to the positive side of the power source and a short to the negative side of the to power source). An amplifier input signal, $A_{INX+}$, is inverted to provide a first input 114 for the amplifier. A second input 116 originates with the amplifier output signal $A_{OUTX+}$ from the output stage 132 of the amplifier. A gain modification device 118 is connected to the second input 116, which may be increasing or reducing an amplitude of the signal from the output stage 132 to match the amplifier input signal. A first difference element 120a connected to the gain modification device 118 and the first input 114 subtracts the amplifier input signal $A_{INX}$ from the gain-modified second input 116, $V_{OUT\_G}$, and outputs a difference voltage 122a. A second difference element 120b connected to the gain modification device 118 and the first input 114 subtracts the gain-modified second input 116, $V_{OUT\_G}$, from the amplifier input signal $A_{INX+}$ and outputs a difference voltage 122b. A first comparator 124a, connected to the first difference element 120a and a threshold voltage source 126, compares the first difference voltage 122a to a threshold voltage 128. A second comparator 124b, connected to the second difference element 120b and a threshold voltage source 126, compares the second difference voltage 122b to a threshold voltage 128. A disabling device 130 is connected to the first comparator 124a, the second comparator 124b and the output stage 132 of the amplifier, wherein the output stage 132 is disabled when the threshold voltage 128 is exceeded by the first difference voltage 122a or the second difference voltage 122b. An indicator 134a can indicate when a short is likely to involve the battery. An indicator 134b can indicate when a short is likely to involve the negative rail.

As shown in FIG. 5, the analog inputs to the amplifier $A_{INX+}$ and $A_{INX-}$ are compared with the amplifier outputs $A_{OUTX+}$ and $A_{OUTX-}$. In other words, this scheme compares the actual output of the amplifier ($A_{OUTX+}$ and $A_{OUTX-}$) attenuated by the gain factor with the input signal ($A_{INX+}$ and $A_{INX-}$). For most audio power amplifiers, the distortion on the output signal ($A_{OUTX+}$ and $A_{OUTX-}$) even under heavy load conditions is very low (regularly less than 0.5% THD+N at maximum power). So the signals $V_{OUT\_G}$ and $A_{INX}$ as shown in FIG. 5 are substantially replicas of each other during normal operation. The difference between signals $V_{OUT\_G}$ and $A_{INX}$ is amplified by the transconductor or $G_M$ stage. The $G_M$ stage produces a non-zero current $I_X$ when $V_{OUT\_G}$ is positive with respect to $A_{INX}$. In the event of a short circuit to VBATT, the signal $V_{OUT\_G}$ becomes the battery voltage divided by twice the gain (VBATT/2G). The $G_M$ stage amplifies the difference between (VBATT/2G) and $A_{INX}$ The output of the $G_M$ stage is the $V_{DETECT+}$ signal, which is now fed into the comparator (COMP1). The comparator will trip once the $V_{TH}$ threshold is exceeded and the signal SC_PLUS_VP_OUT$_x$, will be pulled high (signaling a short to the positive side of the power source (VP+) or VBATT). The DISABLE signal will also pull high and turn off the output stage 132 of the corresponding audio amplifier channel.

Figure 6:
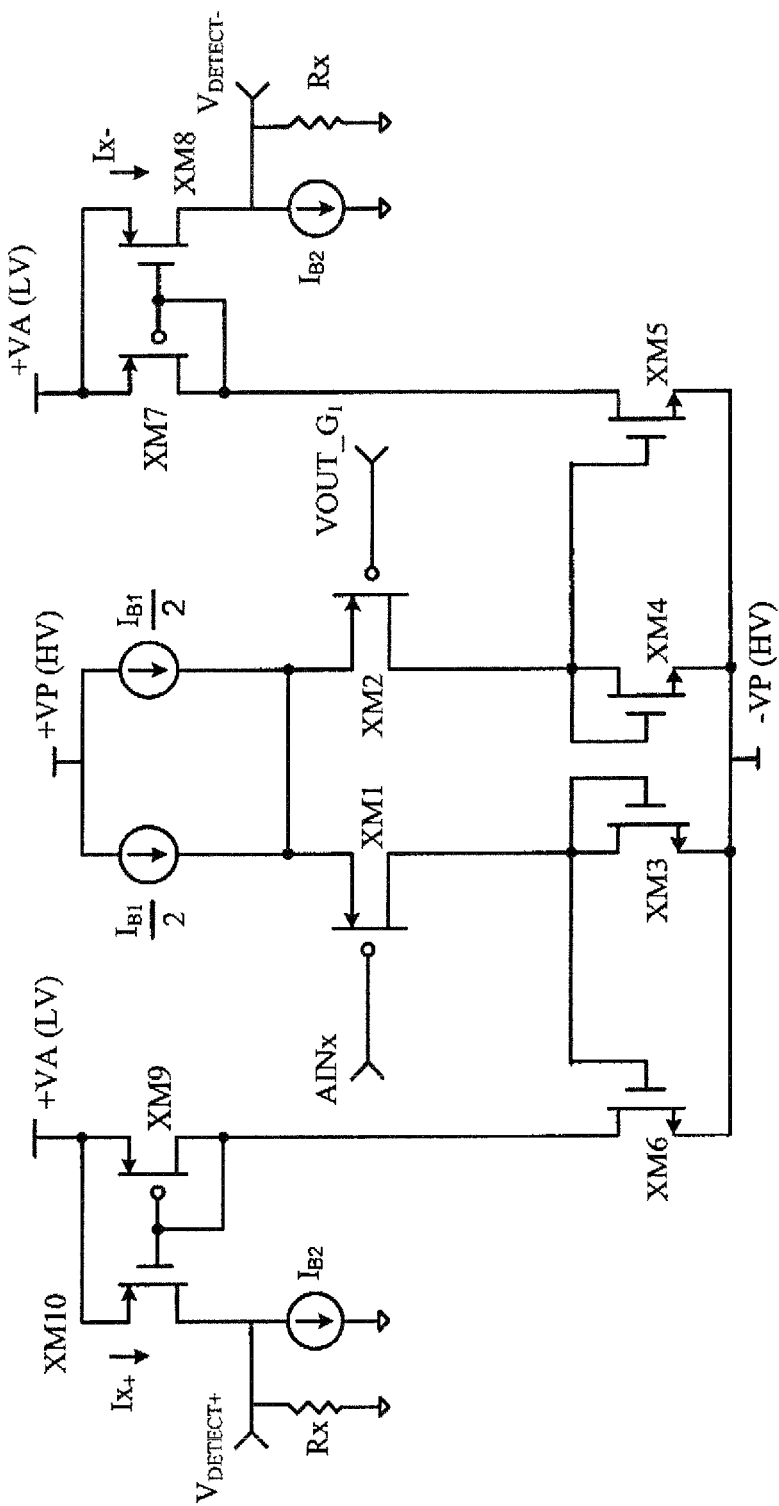
FIG. 6 is an illustration of a simplified circuit implementation of a $G_M$ stage for the short circuit protection system of FIG. 5 to detect shorts to both positive and negative voltages, in accordance with the second exemplary embodiment of the present disclosure.
Figure 7A:
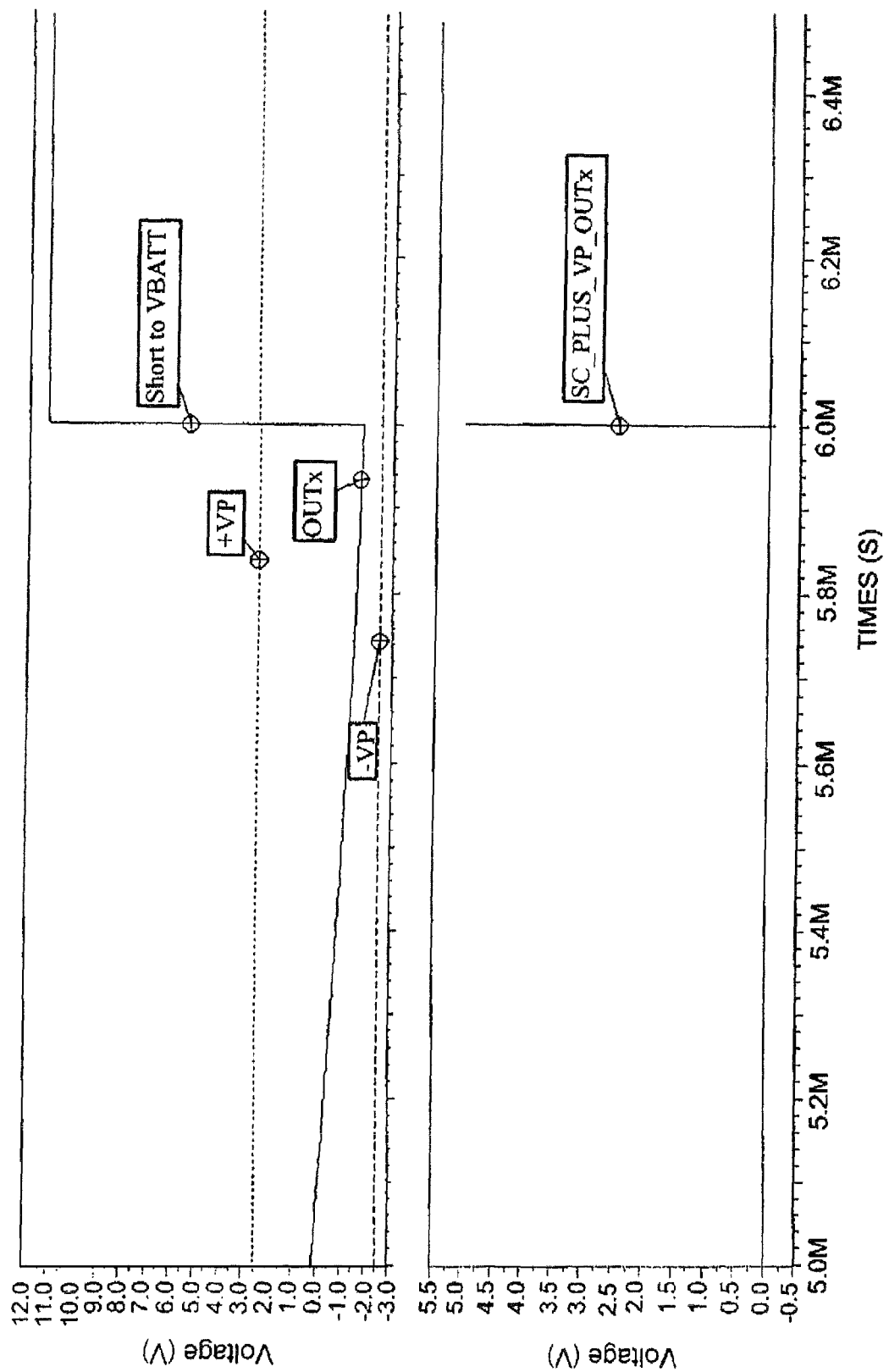
FIGS. 7(a)-(d) shows the simulation results for the short circuit protection system illustrated in FIG. 5, in accordance with the second exemplary embodiment of the present disclosure.
Figure 7B:
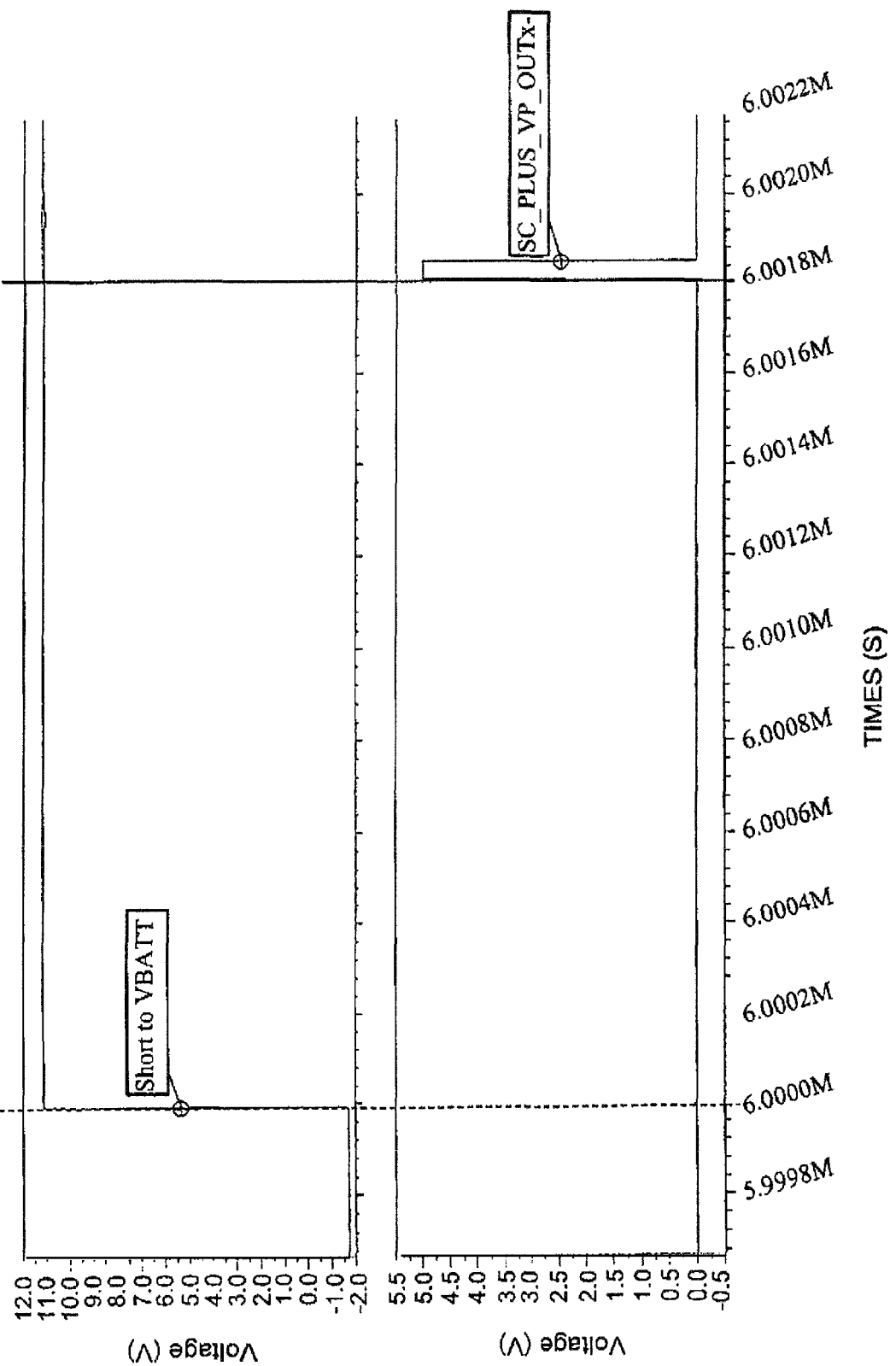
Figure 7C:
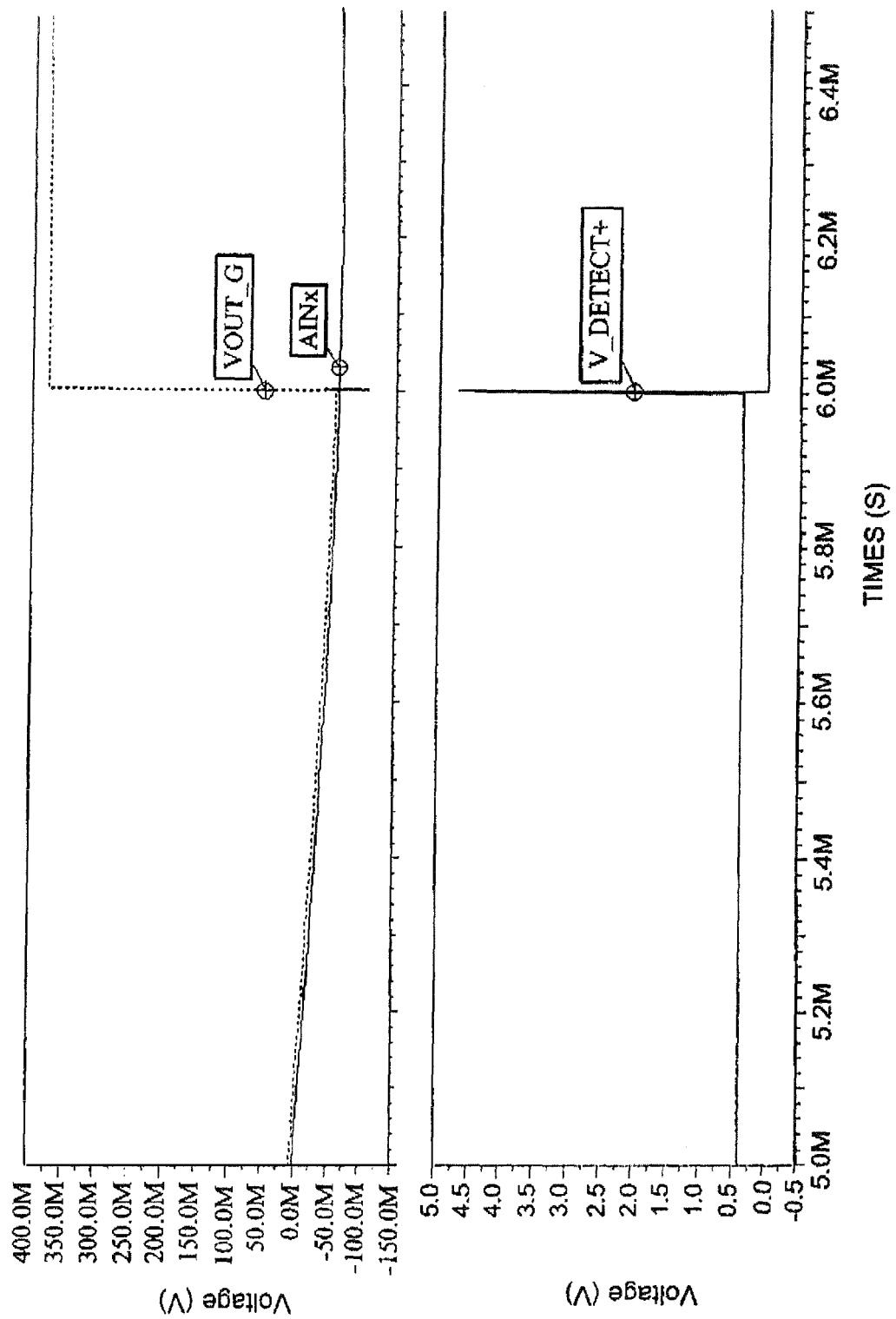
Figure 7D:
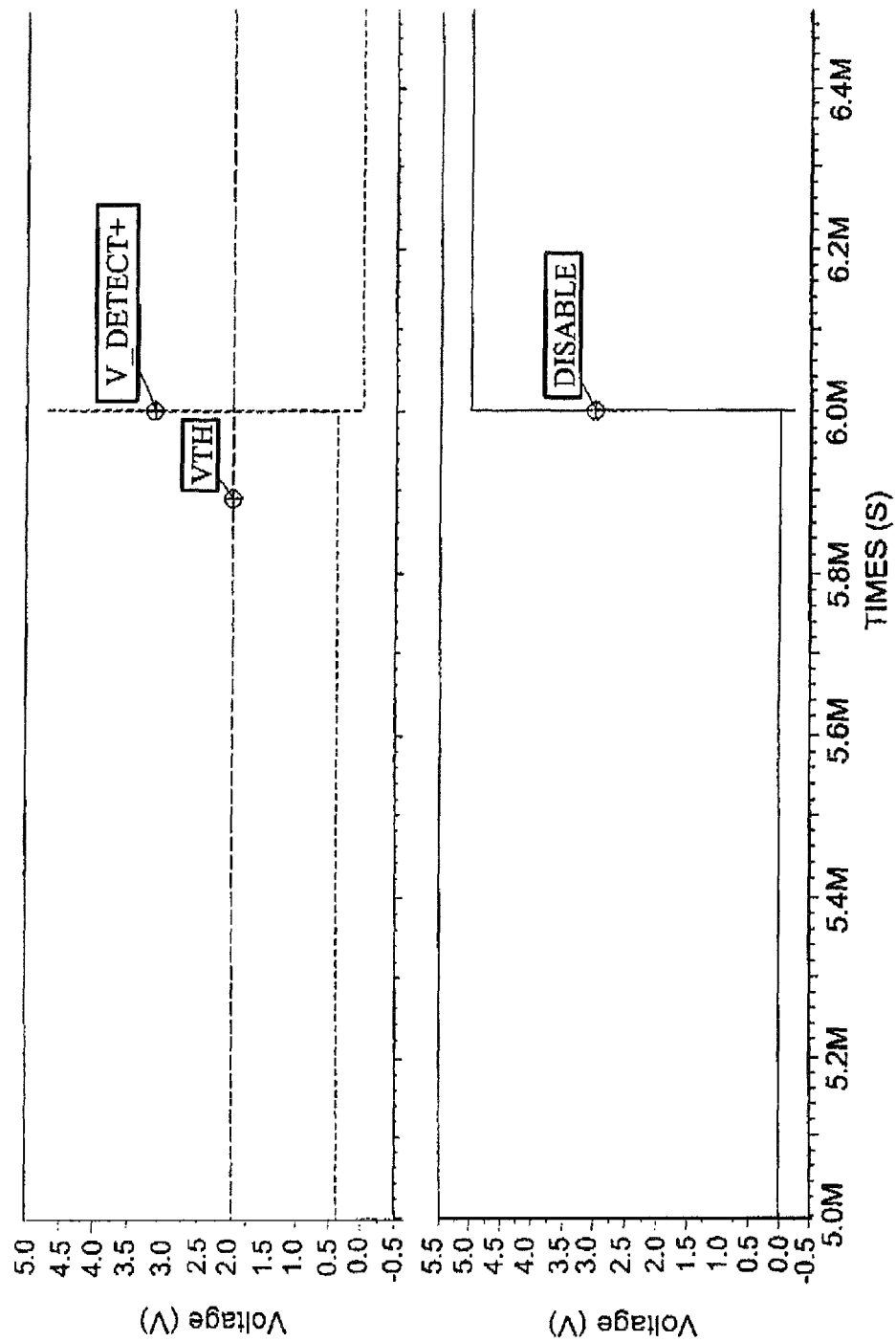

Short to negative power source voltage (−VP) detection is also shown in FIG. 5. In this case, a second $G_M$ stage with flipped inputs is used. This $G_M$ stage reacts with a non-zero current $I_X$ when $V_{OUT\_G}$ is negative compared to $A_{INX}$. FIG. 6 is an illustration of a simplified circuit implementation of a $G_M$ stage for the short circuit protection system of FIG. 5 to detect shorts to both positive and negative voltages in accordance with the second exemplary embodiment of the present disclosure. If $V_{OUT\_G}$ signal is equivalent to the battery voltage divided by the gain (VBATT/G) for a short to battery, device XM2 will cut off while device XM1 will conduct current IB1. This current will be mirrored by current mirrors XM3/XM6 and XM9/XM10. As a result, the current and voltage $V_{DETECT+}$ will increase. For a short to −VP, device XM1 will be cut-off, and current $I_{X-}$ and voltage $V_{DETECT-}$ will increase.

Figure 1:
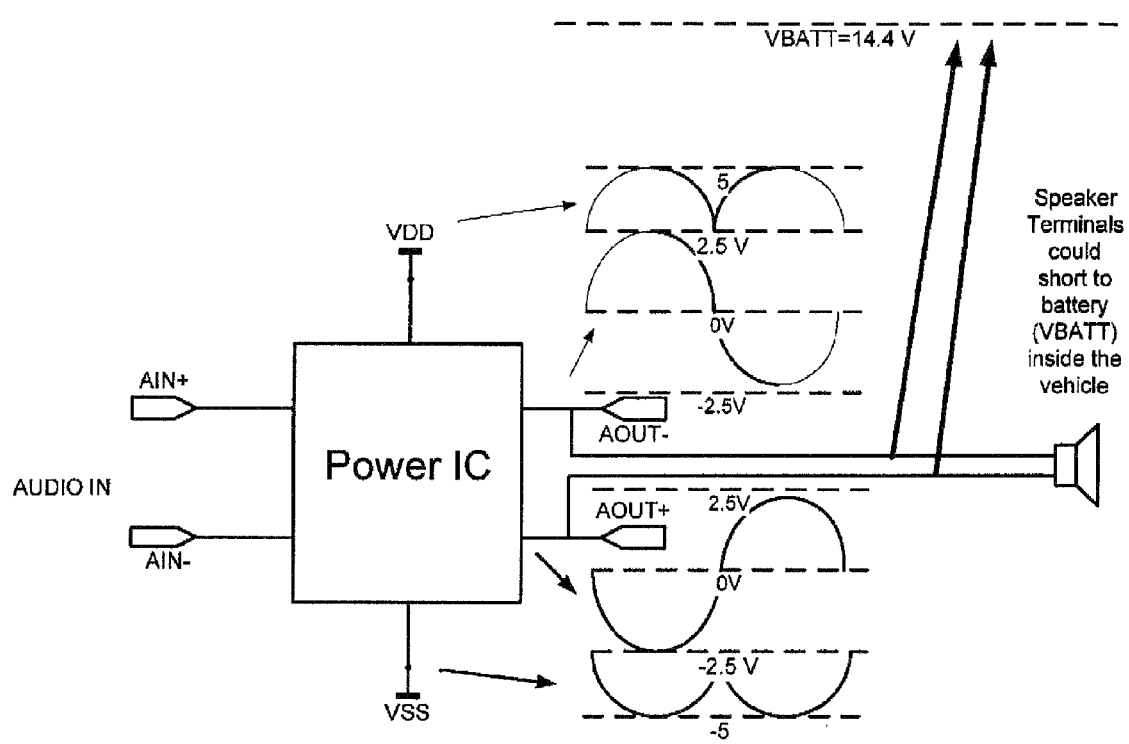
FIG. 1 shows an illustration describing a nominal listening level in a class H audio amplifier in the prior art.
Figure 2:
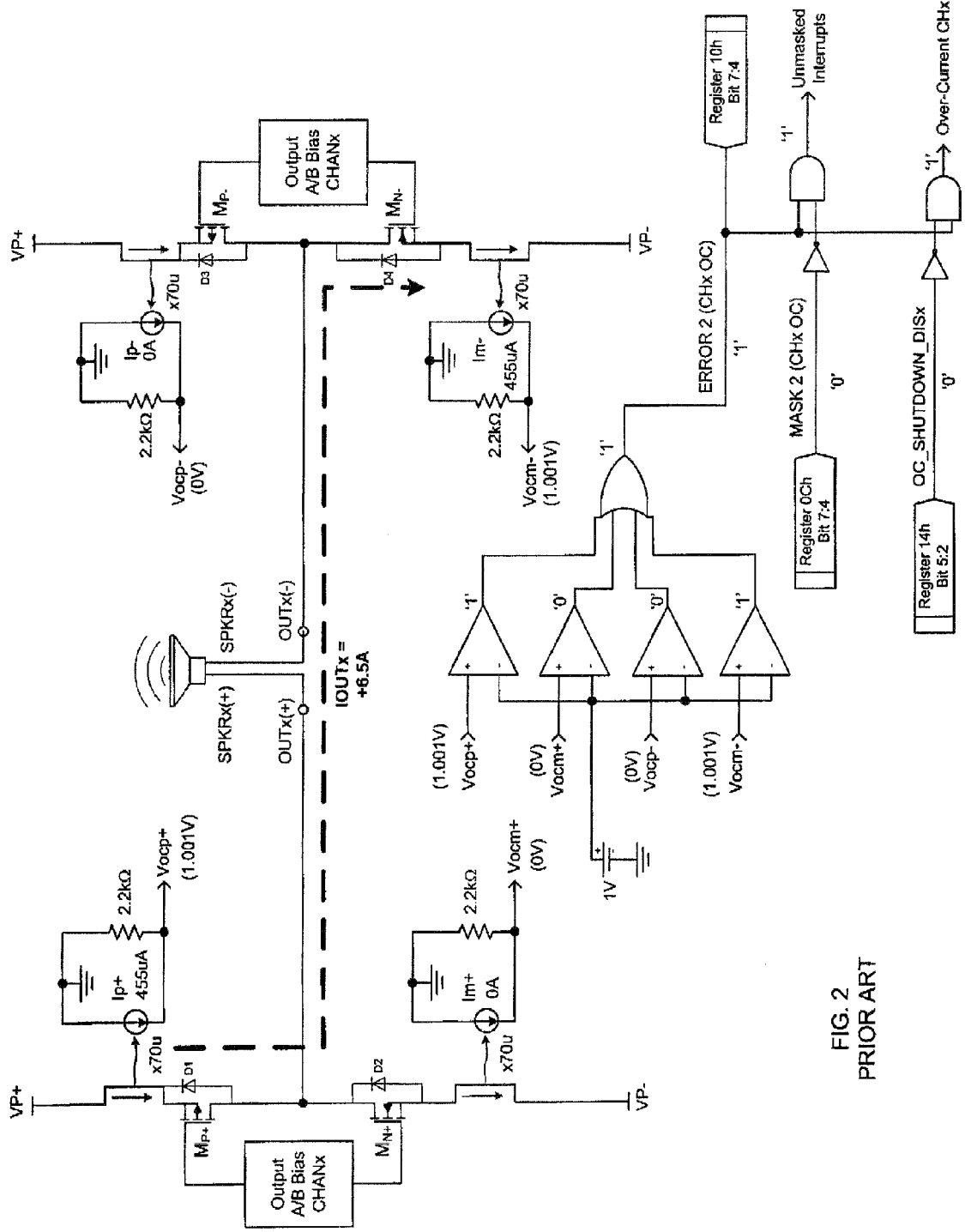
FIG. 2 is an illustration of the block diagram of the over-current scheme implemented in an exemplary power integrated circuit in the prior art.
Figure 3A:
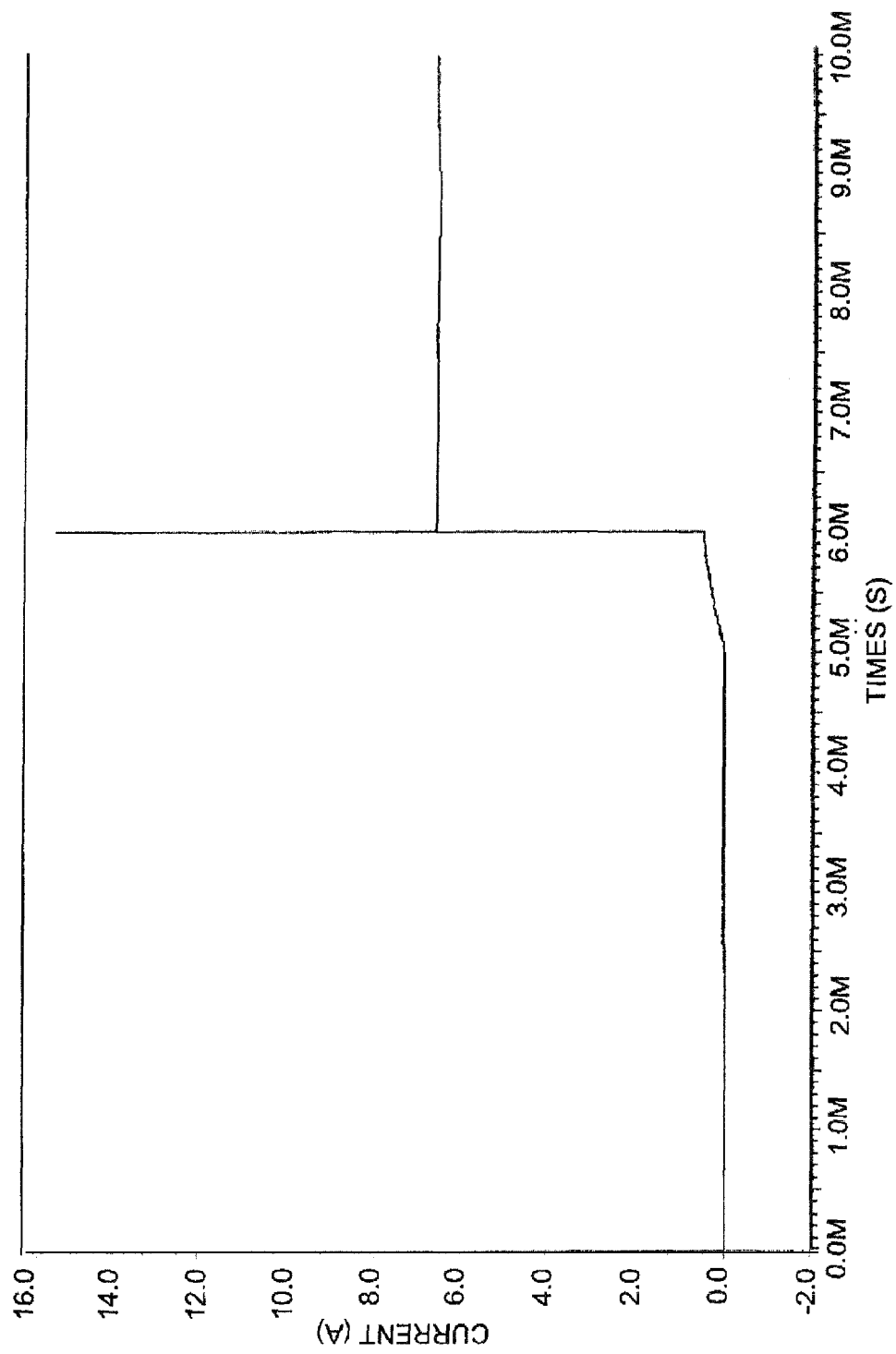
FIGS. 3(a)-(d) is an illustration of exemplary simulation results for a speaker terminal short circuit to battery voltage in the prior art.
Figure 3B:
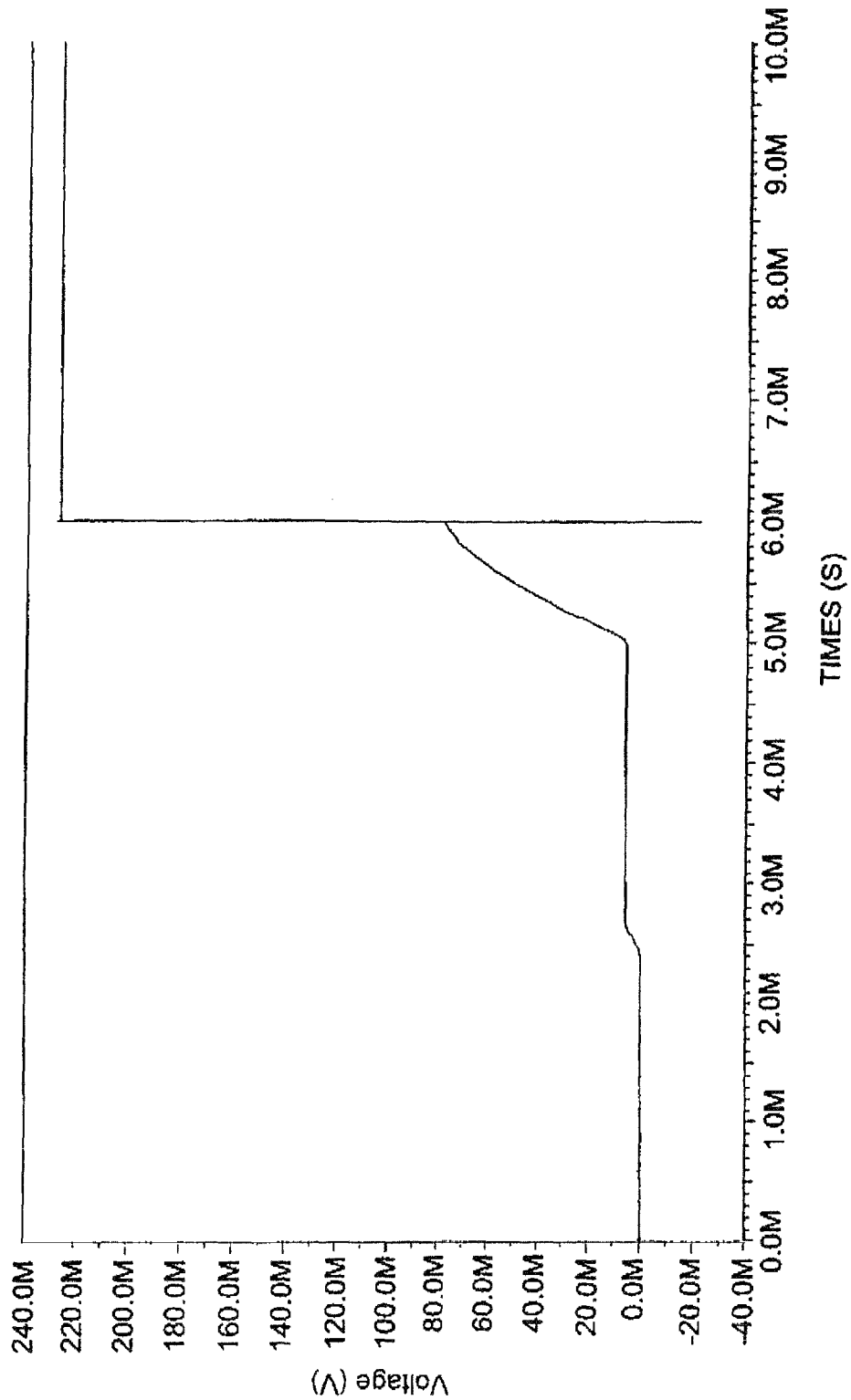
Figure 3C:
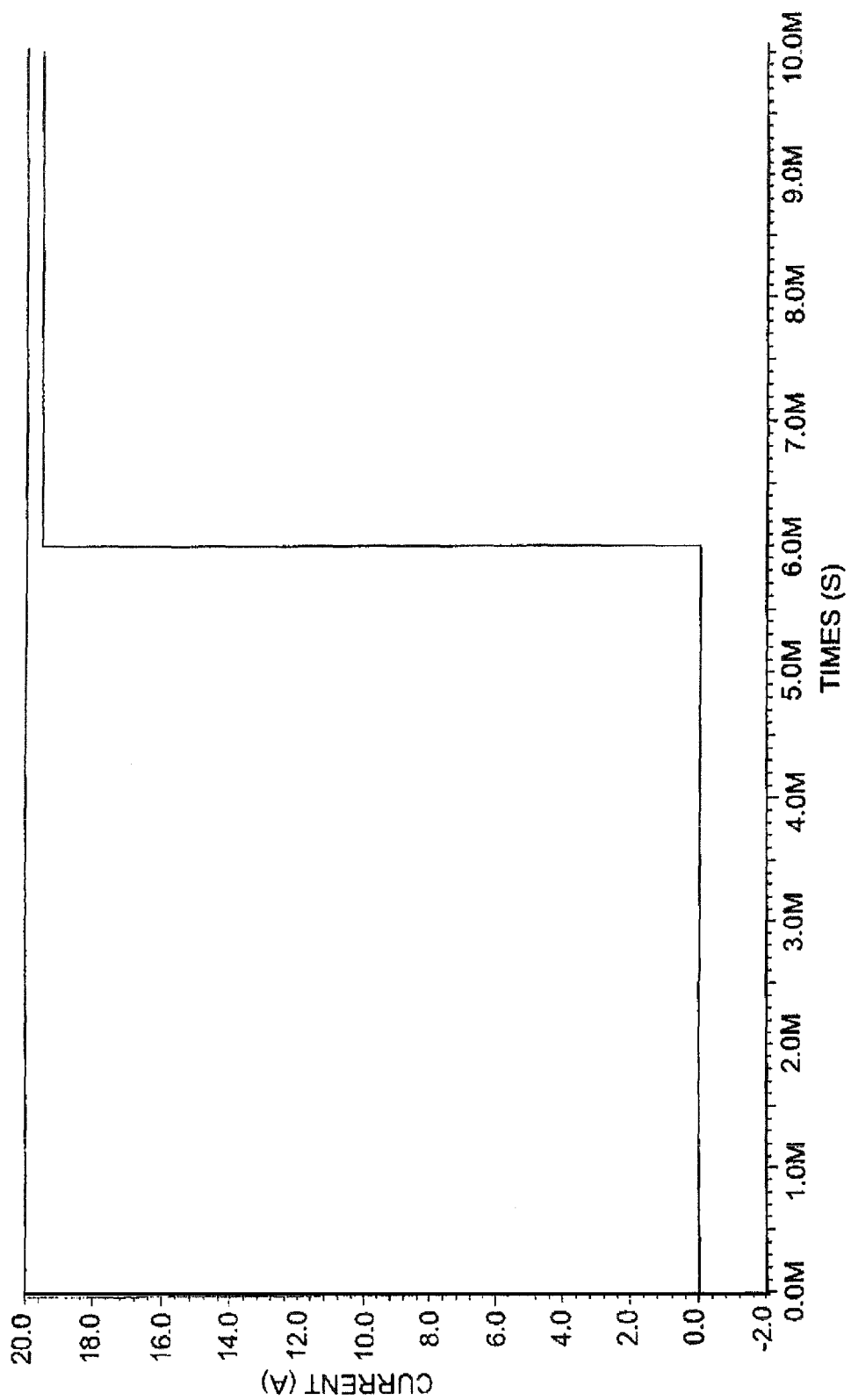
Figure 3D:
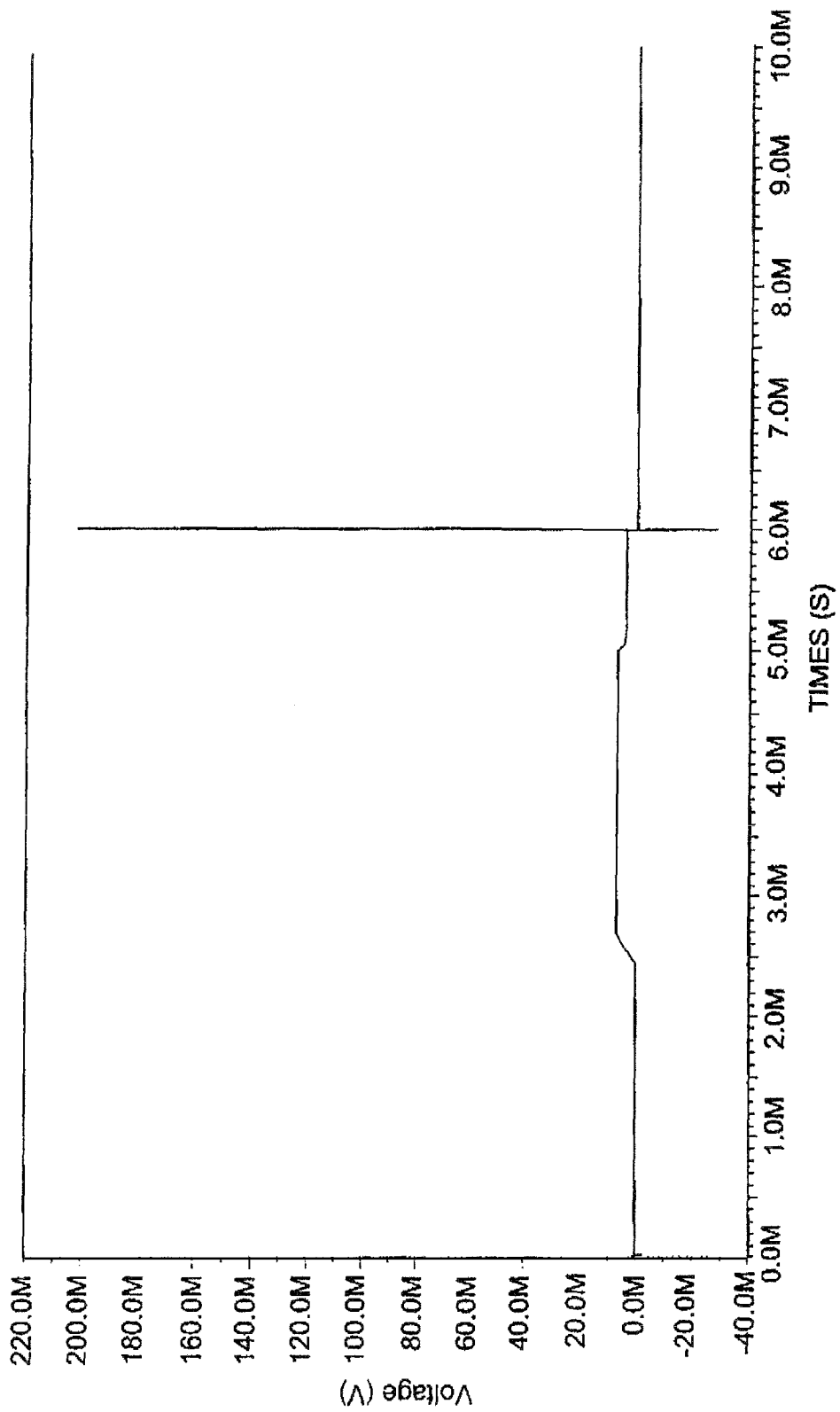

FIGS. 7(a)-(d) shows the simulation results for the short circuit protection system 110 illustrated in FIG. 5, in accordance with the second exemplary embodiment of the present disclosure. The simulation test bench was set up to match the scenario depicted in FIG. 1, (i.e., +/−VP=+/−2.5V and output shorted to VBATT). The simulation results can be compared to the simulation results illustrated in FIGS. 3(a)-(d). In FIGS. 7(a)-(d), it is clear that short to battery is detected very quickly (within 2 microseconds) unlike the scenario in FIGS. 3(a)-(d). The simulation in FIGS. 3(a)-(d) uses prior art overcurrent detection which fails to detect a short to battery and is unable to protect the chip.

Figure 8:
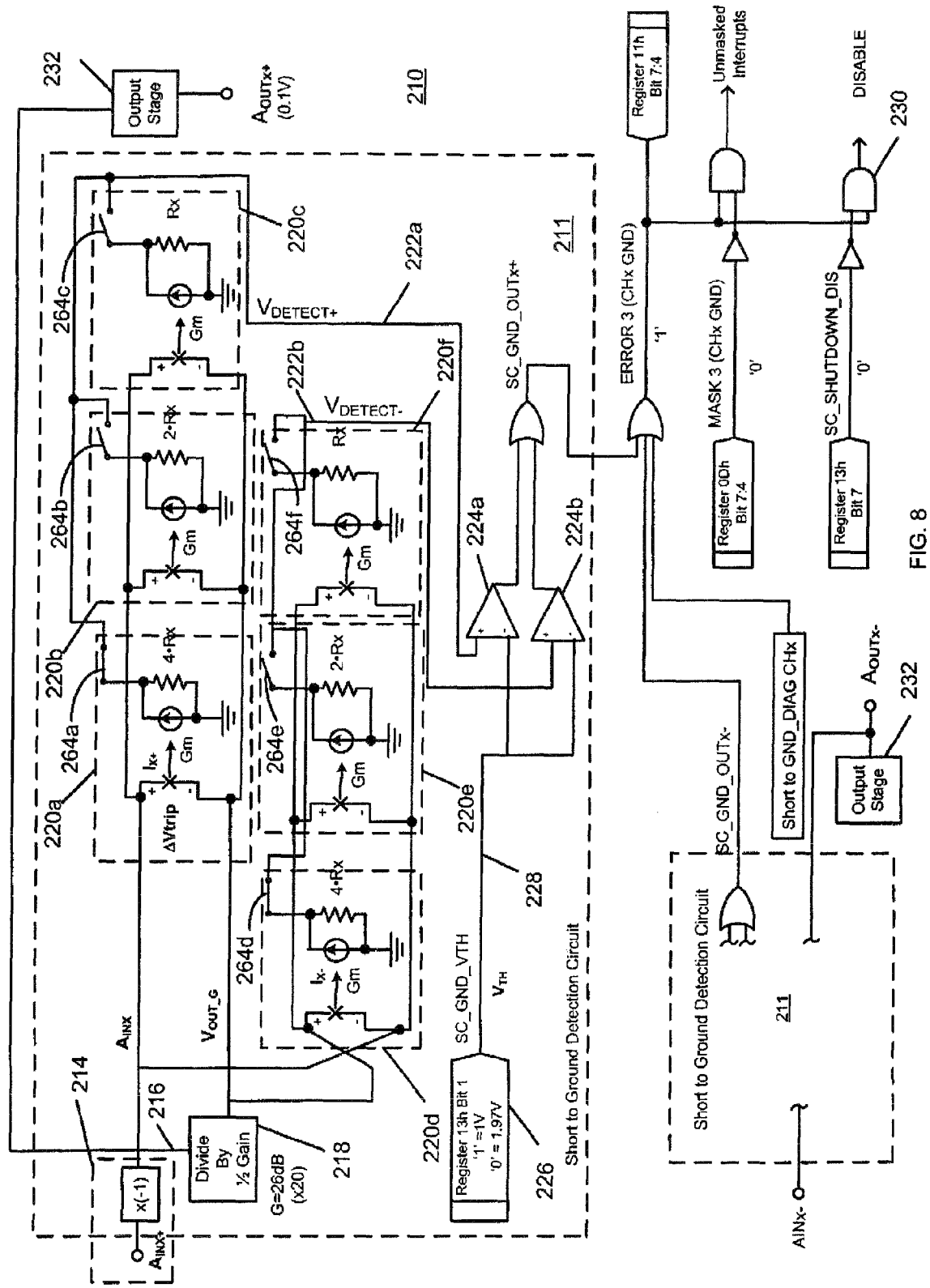
FIG. 8 is an illustration of a block diagram of a short circuit protection system in accordance with a third exemplary embodiment of the present disclosure.

FIG. 8 is an illustration of a block diagram of a short circuit protection system 210 in accordance with a third exemplary embodiment of the present disclosure applied for a fully differential amplifier. The short circuit protection system 210 includes two substantially similar short to ground detection circuits 211. A first input 214 receives a signal $A_{Inx+}$ from an input for the amplifier. A second input 216 receives a signal from the output stage 232 of the amplifier. A gain modification device 218 is connected to the second input 216 thereby reducing an amplitude of the signal from the output stage 232. A first difference element 220a connected to the gain modification device 218 and the first input 214 subtracts the gain-modified second input 216, $V_{OUT\_G}$, from the amplifier input signal $A_{INX}$ and, when switched in, outputs a first difference voltage 222a. A second difference element 220b connected to the gain modification device 218 and the first input 214 subtracts the gain-modified second input 216, $V_{OUT\_G}$, from the amplifier input signal $A_{INX}$ and, when switched in, outputs a first difference voltage 222a. A third difference element 220c connected to the gain modification device 218 and the first input 214 subtracts the gain-modified second input 216, $V_{OUT\_G}$, from the amplifier input signal $A_{INX}$ and, when switched in, outputs a first difference voltage 222a. The short circuit protection system 210 can be optimized for a short to GND detection based upon the first input 214 level. This optimization can be achieved by real time variation of $V_{TH}$ or Rx. The switching scheme for the first, second, and third difference elements 220(a-c) is one possible example on how the value of Rx can be changed as the first input 214 level varies.

A fourth difference element 220d connected to the gain modification device 218 and the first input 214 subtracts the amplifier input signal $A_{INX}$ from the gain-modified second input 216, $V_{OUT\_G}$, and, when switched in, outputs a second difference voltage 222b. A fifth difference element 220e connected to the gain modification device 218 and the first input 214 subtracts the amplifier input signal $A_{INX}$ from the gain-modified second input 216, $V_{OUT\_G}$, and, when switched in, outputs a second difference voltage 222b. A sixth difference element 220f connected to the gain modification device 218 and the first input 214 subtracts the amplifier input signal $A_{INX}$ from the gain-modified second input 216, $V_{OUT\_G}$, and, when switched in, outputs a second difference voltage 222b. A first comparator 224a, connected to one of the first, second, or third difference elements 220(a-c) and a threshold voltage source 226, compares the first difference voltage 222a to a threshold voltage 228. A second comparator 224b, connected to one of the fourth, fifth, or sixth difference elements 220(d-f) and a threshold voltage source 226, compares the second difference voltage 222b to a threshold voltage 228. A disabling device 230 is connected to the first comparator 224a, the second comparator 224b, and the output stage 232 of the amplifier, wherein the output stage 232 of the amplifier is disabled when the threshold voltage 228 is exceeded by the first difference voltage 222a or the second difference voltage 222b. As shown in FIG. 8, the difference elements 220(a-c) and 220(d-f) have inverted inputs. The input arrangement is preferred so that the short to GND is detected irrespective of whether $A_{INX}$ is positive or negative with respect to GND when a short to GND occurs.

Figure 8A:
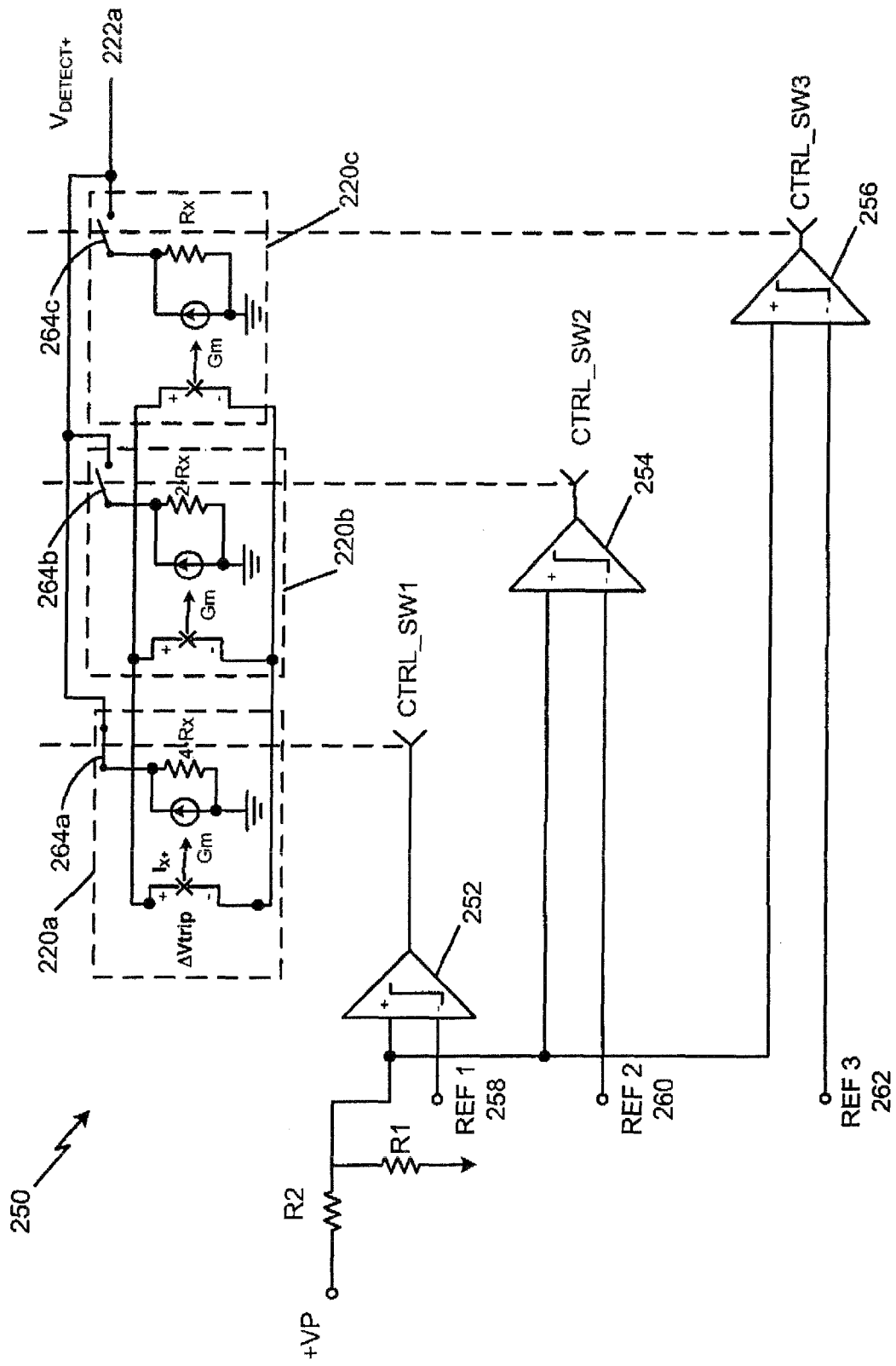
FIG. 8A is an illustration of a block diagram of an element of the short circuit protection system shown in FIG. 8, in accordance with the third exemplary embodiment of the present disclosure.

FIG. 8A is an illustration of a block diagram of an element of the short circuit protection system 210 shown in FIG. 8, in accordance with the third exemplary embodiment of the present disclosure. More specifically, FIG. 8A illustrates one embodiment of a switching control system 250 (not shown in FIG. 8A. need to show) for controlling the difference elements 220a-c (and 220d-f as shown in FIG. 8). As is shown in FIG. 8A, the amplifier power source +VP is connected to a first, a second, and a third comparator 252, 254, 256 (not shown in FIG. 8A. need to show). Each of the comparators 252, 254, 256 is also connected to a reference voltage 258, 260, 262 (not shown in FIG. 8A. need to show). The reference voltages 258, 260, 262 may be arranged such that for a relatively small power source voltage +VP, a first switch 264a for the first difference element 220a is closed and the second and third switches 264b, 264c for the second and third difference elements 220b, 220c are open. For a relatively middling power source voltage +VP, the second switch 264b for the second difference element 220b is closed and the first and third switches 264a, 264c for the first and third difference elements 220a, 220c are open. And for a relatively large power source voltage +VP, the third switch 264c for the third difference element 220c is closed and the first and second switches 264a, 264b for the first and second difference elements 220a, 220b are open. The different resistance values (Rx, 2·Rx, 4·Rx) help to control the magnitude of the first difference voltage 222a as a function of the power source voltage +VP. This arrangement sets the first difference voltage 222a, which is the non-inverting input to comparator 224a, to a level that is optimized for fast and more accurate detection of short to ground based upon power source voltage +VP. The first, second, and third comparators 252, 254, 256 may also control the fourth, fifth, and sixth difference elements 220d, 220e, 220f, respectively. That is, as shown in the exemplary embodiment of FIG. 8, the fourth switch 264d in the fourth difference element 220d should open and close somewhat synchronously with the first switch 264a. Likewise, the fifth switch 264e should open and close somewhat synchronously with the second switch 264b and the sixth switch 264f should open and close somewhat synchronously with the third switch 264c. The embodiment shown in FIG. 8 and FIG. 8A is just one example of how a control system could be configured, and one having ordinary skill in the art will understand that more or fewer difference elements, multiples of resistance values, etc. can be utilized without meaningfully altering the present disclosure.

In one embodiment, it would be useful to make the threshold voltage source 226 a function of the input current and the gain. By making the threshold voltage source 226 variable in accordance with other elements of the circuit, subtle material deviations can be detected more quickly. In such an embodiment, it would be useful to use a digital circuit, as would be understood by one having ordinary skill in the art, to make the threshold voltage source 226 a product of the amplifier input signal $A_{INX}$, the gain, and the gain and resistance from, for example, the third difference element 220c such that $V_{TH} = A_{INX} \cdot G_M \cdot Rx$.

Figure 8B:
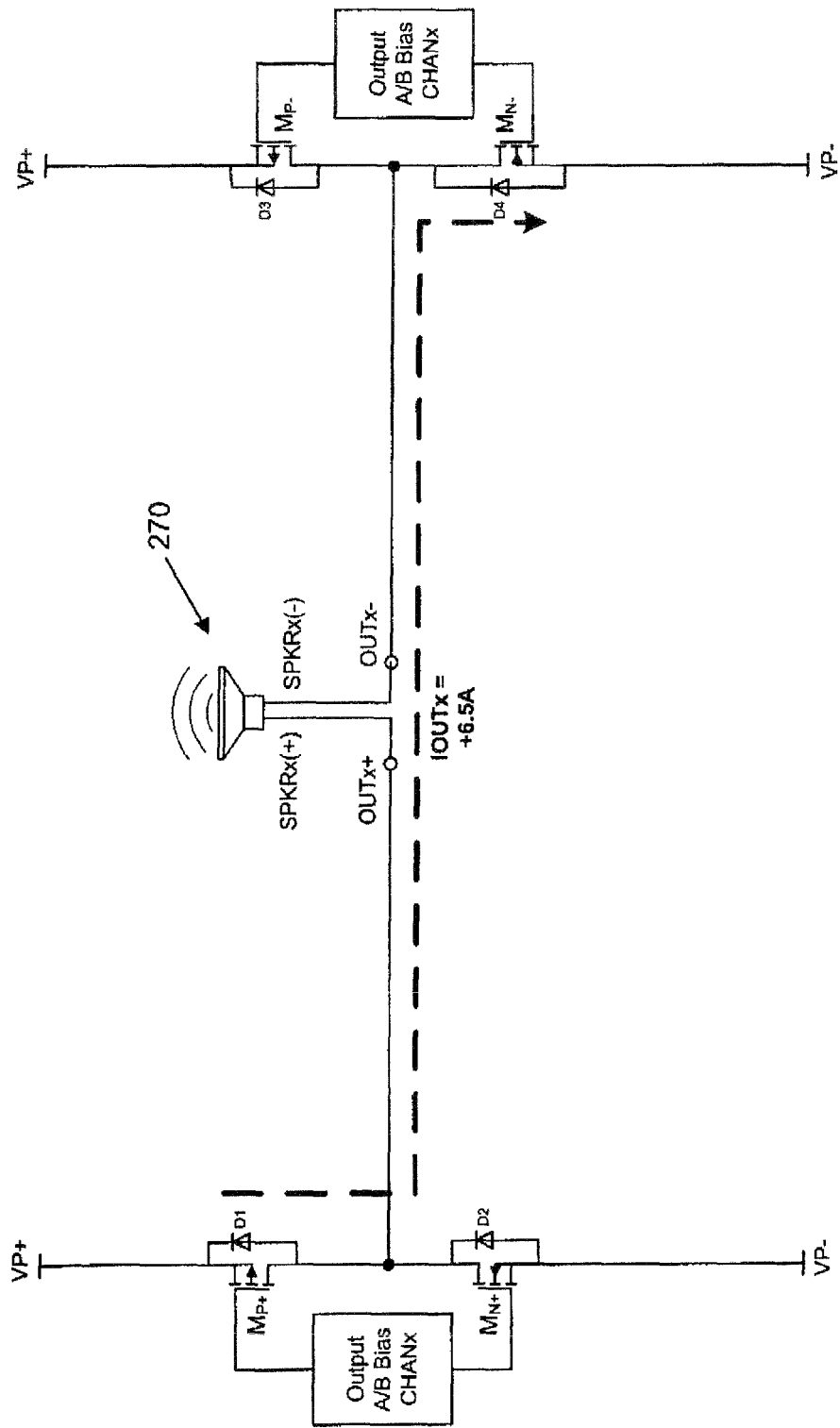
FIG. 8B is an illustration of a block diagram of an element of the short circuit protection system shown in FIG. 8, in accordance with the third exemplary embodiment of the present disclosure.

FIG. 8B is an illustration of a block diagram of an element of the short circuit protection system 210 shown in FIG. 8, in accordance with the third exemplary embodiment of the present disclosure. Under normal operation, the amplifier power source voltage VP+ powers the speaker 270. Current travels through mosfets $M_{P+}$, $M_{N-}$ during normal operation and through mosfets $M_{P-}$, $M_{N+}$ during the inverting output. If a short is detected, the disabling device 230 communicates with the mosfet switches and the mosfet switches $M_{P+}$, $M_{P-}$, $M_{N+}$, $M_{N-}$ are opened, reducing the risk of overloading and causing damage to the speaker.

Shorted speakers can be detected using a scheme very similar to FIG. 8. The principle of comparing amplifier outputs (attenuated by gain factor) with the actual input signal works for shorted speaker detection as well. During a shorted speaker event, the amplifier outputs phase relationship with the input changes, which gets immediately amplified by the $G_M$ stage. Furthermore, this novel scheme is able to detect a shorted speaker much faster than an overcurrent, thereby turning off the output stage before the onset of very high current through the output devices. This scheme improves device reliability under repeated short circuit conditions.

Figure 9:
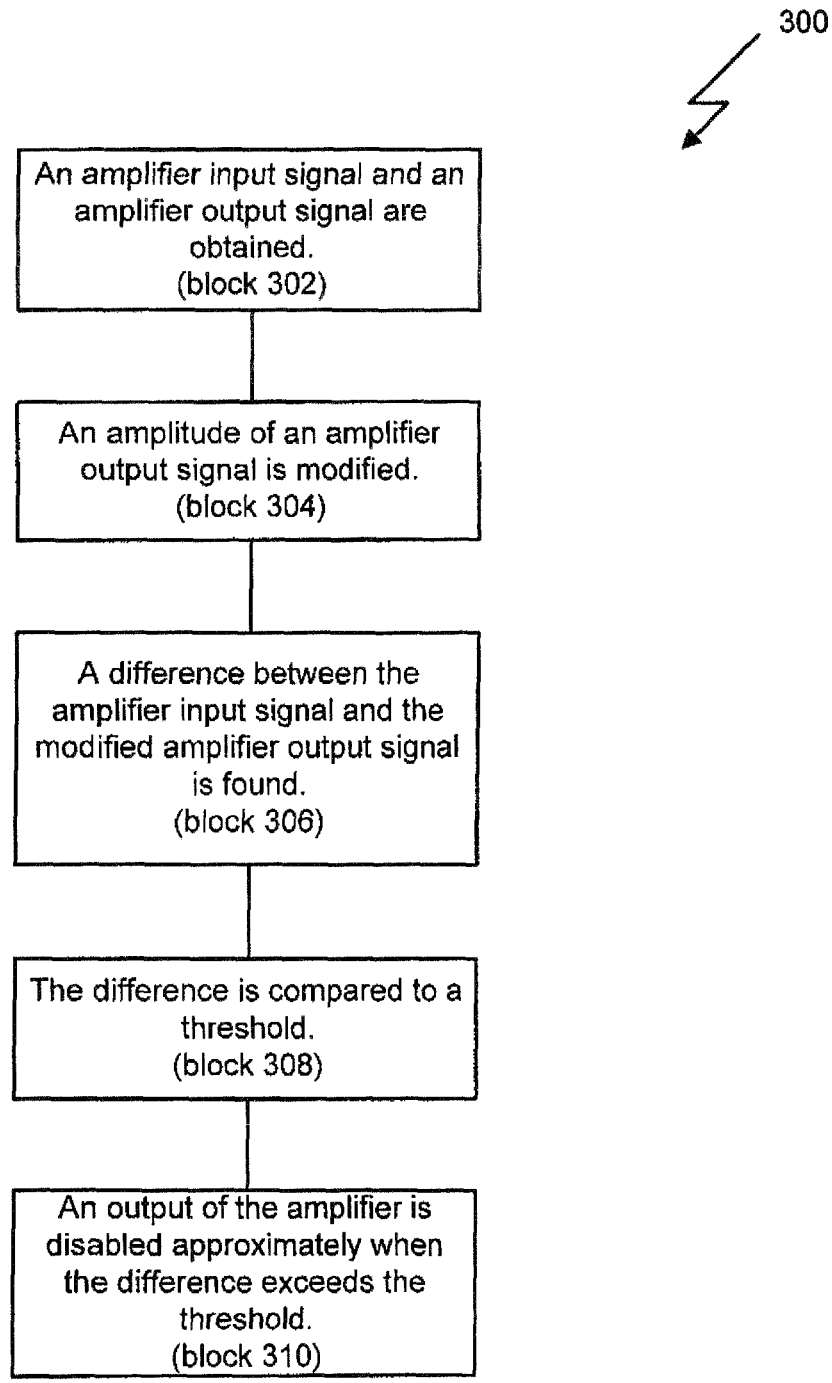
FIG. 9 is an illustration of a flowchart illustrating a method of providing the short circuit protection system of FIG. 4, in accordance with the first exemplary embodiment of the present disclosure.

FIG. 9 is an illustration of a flowchart 300 illustrating a method of providing the short circuit protection system 10 of FIG. 4, in accordance with the first exemplary embodiment of the present disclosure. It should be noted that any process descriptions or blocks in flow charts should be understood as representing modules, segments, portions of code, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

As is shown by block 302, an amplifier input signal and an amplifier output signal are obtained. An amplitude of an amplifier output signal is modified (block 304). A difference between the amplifier input signal and the modified amplifier output signal is found (block 306). The difference is compared to a threshold (block 308). An output of the amplifier is disabled approximately when the difference exceeds the threshold (block 310).

It should be emphasized that the above-described embodiments of the present disclosure, particularly, any "preferred" embodiments, are merely possible examples of implementations, merely set forth for a clear understanding of the principles of the disclosed system and method. Many variations and modifications may be made to the above-described embodiments of the disclosure without departing substantially from the spirit and principles of the disclosure. All such modifications and variations are intended to be included herein within the scope of this disclosure and protected by the following claims.

What is claimed is:

1. A system for short circuit protection for an amplifier, the system comprising:
   a first input receives a signal from an amplifier input for the amplifier;
   a second input receives a signal from an output of the amplifier;
   a gain modification device connected to the second input thereby reducing an amplitude of the signal from the amplifier output;
   a difference element subtracting one of the first input and the second input from the other of the first input and the second input and outputting a difference voltage;
   a comparator connected to the difference element and a threshold voltage source, wherein the difference voltage is compared to a threshold voltage; and
   a disabling device connected to the comparator and an output stage of the amplifier, wherein an output stage of the amplifier is disabled when the threshold voltage exceeds the difference voltage, wherein the difference element further comprises:
   a first difference element subtracting the first input from the second input and outputting a first difference voltage, wherein the comparator is connected to the first difference element; and a second difference element subtracting the second input from the first input and outputting a second difference voltage.

2. The system of claim 1, wherein the comparator further comprises:
a first comparator connected to the first difference element and a threshold voltage source, wherein the first difference voltage is compared to a threshold voltage; and
a second comparator connected to the second difference element and the threshold voltage source, wherein the second difference voltage is compared to the threshold voltage.

3. The system of claim 2, wherein the disabling device is connected to the first comparator, the second comparator, and the output stage, wherein the output stage is disabled approximately when one of the first difference voltage and the second difference voltage exceeds the threshold voltage.

4. The system of claim 3, further comprising an indicator that indicates a short for a class H battery approximately when the first difference voltage exceeds the threshold voltage.

5. A system for short circuit protection for an amplifier, the system comprising:
a first input receives a signal from an amplifier input for the amplifier;
a second input receives a signal from an output of the amplifier;
a gain modification device connected to the second input thereby reducing an amplitude of the signal from the amplifier output;
a difference element subtracting one of the first input and the second input from the other of the first input and the second input and outputting a difference voltage;
a comparator connected to the difference element and a threshold voltage source, wherein the difference voltage is compared to a threshold voltage; and
a disabling device connected to the comparator and an output stage of the amplifier, wherein an output stage of the amplifier is disabled when the threshold voltage exceeds the difference voltage,
wherein the difference element further comprises:
a first difference element subtracting the second input from the first input and outputting a first signal to a switching device;
a second difference element subtracting the second input from the first input and outputting a second signal to the switching device;
wherein the switching device connects one of the first difference element and the second difference to the comparator, whereby the short detection threshold and delay can be optimized.

6. The system of claim 1, wherein the threshold voltage is variable as a function of the first input.

7. A method of providing short circuit protection for an amplifier, the method comprising the steps of:
obtaining an amplifier input signal and an amplifier output signal;
modifying an amplitude of an amplifier output signal;
finding a difference between the amplifier input signal and the modified amplifier output signal; comparing the difference to a threshold;
disabling an output of the amplifier approximately when the difference exceeds the threshold;
electrically connecting the output signal to a battery thereby creating a short; and
disabling the output of the amplifier after electrically connecting the output signal and the battery.

8. The method of claim 7, wherein the threshold is variable as a function of the amplifier input signal.

9. A method of providing short circuit protection for an amplifier, the method comprising the steps of:
obtaining an amplifier input signal and an amplifier output signal;
modifying an amplitude of an amplifier output signal;
finding a difference between the amplifier input signal and the modified amplifier output signal;
comparing the difference to a threshold;
disabling an output of the amplifier approximately when the difference exceeds the threshold;
further comprising the steps of:
determining which of the amplifier input signal and the modified amplifier output signal is greater approximately when disabling the output; and
indicating a short to a battery when the modified amplifier output signal exceeds the amplifier input signal.

10. The method of claim 7, further comprising the steps of:
amplifying the difference between the amplifier input signal and the modified amplifier output signal; and
comparing the amplified difference to a threshold.

11. The method of claim 10, further comprising the steps of modifying an amplification of the difference as a function of the amplifier input signal.

12. The method of claim 10 further comprising the step of switching between different gains to modify an amplification of the difference as a function of the amplifier input signal.

13. A system for short circuit protection for an amplifier, the system comprising:
means for obtaining an amplifier input signal and an amplifier output signal;
means for modifying an amplitude of an amplifier output signal;
means for finding a difference between the amplifier input signal and the modified amplifier output signal;
means for comparing the difference to a threshold; means for disabling an output of the amplifier approximately when the difference exceeds the threshold;
electrically connecting the output signal to a battery thereby creating a short; and
means for disabling the output of the amplifier less than two microseconds after electrically connecting the output signal and the battery.

14. A system for short circuit protection for an amplifier, the system comprising:
means for obtaining an amplifier input signal and an amplifier output signal;
means for modifying an amplitude of an amplifier output signal;
means for finding a difference between the amplifier input signal and the modified amplifier output signal;
means for comparing the difference to a threshold;
means for disabling an output of the amplifier approximately when the difference exceeds the threshold;
means for determining whether the amplifier input signal and an amplifier output signal is greater approximately when disabling the output; and
means for indicating the reason for disabling is a short to a battery when the amplifier output signal exceeds the amplifier input signal.

15. The system of claim 13, further comprising means for modifying the threshold as a function of the amplifier input signal.

16. The system of claim 13, further comprising means for modifying a gain of a difference element as a function of the amplifier input signal, wherein the means for finding the difference between the amplifier input signal and the modified amplifier output signal further comprises the difference element connected to the amplifier input signal and the modified amplifier output signal.

\* \* \* \* \*